United States Patent [19]

McCaskie et al.

[11] Patent Number: 4,520,046

[45] Date of Patent: May 28, 1985

[54] METAL PLATING ON PLASTICS

[75] Inventors: John E. McCaskie, North Merrick; Chris Tsiamis, New York, both of N.Y.

[73] Assignee: LeaRonal, Inc., Freeport, N.Y.

[21] Appl. No.: 510,428

[22] Filed: Jun. 30, 1983

[51] Int. Cl.³ .............................................. C23C 3/02
[52] U.S. Cl. .................................. 427/304; 156/668; 204/38.4; 427/306; 427/307
[58] Field of Search ................ 156/668; 427/307, 304, 427/306; 204/38 B

[56] References Cited

U.S. PATENT DOCUMENTS

| | | | |
|---|---|---|---|
| 3,563,784 | 2/1971 | Innes | 427/306 |
| 4,039,714 | 8/1977 | Roubal | 427/307 |
| 4,301,190 | 11/1981 | Feldstein | 427/306 |
| 4,308,301 | 12/1981 | Huss | 156/668 |

FOREIGN PATENT DOCUMENTS

| | | | |
|---|---|---|---|
| 0044878 | 2/1982 | European Pat. Off. | 427/306 |
| 3146164 | 5/1983 | Fed. Rep. of Germany. | |

OTHER PUBLICATIONS

Lea Ronal Technical Bulletin, "LeaRonal Ronamet", Apr. 30, 1980.
J. E. McCaskie and C. Tsiamis, "A Gaseous Acid Etch System to Prepare Plastics for Plating", *Plating and Surface Finishing*, Jul., 1982.
J. E. McCaskie, C. Tsiamis, and H. Gerhardt, "Ronabond Vest for EMI/RFI Shielding", Oct., 1982.
ASTM Standard B08.02.05 "Standard Practice for Preparation of Plastics Materials for Electroplating".

*Primary Examiner*—John D. Smith
*Attorney, Agent, or Firm*—Pennie & Edmonds

[57] ABSTRACT

A simple and highly effective process for preparing the surface and plating a plastic or elastomer material is disclosed by the present invention.

A uniform, highly adherent metal layer is deposited by the claimed process. The surface of the materials to be plated is prepared by exposure to a gas etch atmosphere and activation of the etched surface by providing a metal colloid thereon. Another aspect relates to the use of a one-step or two-step conditioner treatment in the process for improved results.

After the surface preparation and activation, a desired metal coating can be electroless metal plated in a conventional manner.

16 Claims, No Drawings

METAL PLATING ON PLASTICS

TECHNICAL FIELD

The present invention relates to a process for metal plating various plastic or elastomeric materials with metals and more particularly, to an improvement in the process of preparing the surface of these materials so as to provide them with a base or prime coat which will readily accept metal plating.

DESCRIPTION OF THE PRIOR ART

It is well known in the art that electroplated metal coatings will not bond or adhere to plastic or elastomeric materials unless the surfaces of these materials are first suitably prepared. A common treatment would include etching the plastic with solutions containing chromium trioxide such as chromic acid or mixed acid combinations of the chromic/sulfuric or chromic/sulfuric/phosphoric types. These strongly oxidizing solutions micro-roughen and chemically alter the surface of the plastic materials by forming polar organic functional groups such as $R-SO_3-H$, $R-CO_2-H$, and $R-CH=O$. The presence of these polar groups promotes adsorption of plating catalysts from aqueous solutions which allows subsequent metal deposition to readily occur.

There are two main disadvantages of using solutions containing chromium trioxide. First, the concentration of these solutions must be controlled within a predetermined narrow range or during the subsequent plating step, the plastic surface will either be plated non-uniformly or fully plated with a coating of inadequate bond strength. A further disadvantage relates to the removal and detoxification of hexavalent chromium compounds from these solutions. In an effort to avoid these problems, treating solutions based on alternate chemicals have been sought.

Processes utilizing treating solutions of sulfonating agents have been tested as substitutes for chromium trioxide. Initial attempts in this area included liquid phase sulfonation using solutions of dilute sulfur trioxide in an inert chlorinated solvent, chlorosulfonic acid, concentrated sulfuric acid or oleum, and vapor phase sulfonation using dilute gaseous sulfur trioxide, chlorosulfonic acid, or fluorosulfonic acid in an inert gas. Examples of these processes are found in U.S. Pat. Nos. 3,607,350, 3,578,484, 2,945,842, 2,937,066, and 2,854,477.

A disadvantage of these liquid phase sulfonation solutions is that extreme roughening of the surface of the plastic occurs rapidly so that short term exposures are required. Also, if the plastic is held in these solutions for too long a period of time, it will decompose, char, or carbonize. This degradation does not occur when vapor phase sulfonation is used, but, if moisture is present, it can combine with the sulfur trioxide to form sulfuric acid. This acid condenses on the surface of the plastic and prevents uniform conditioning of the entire surface, which after subsequent electroplating, results in a nonuniform metal coating.

An improved sulfonation process for treating or conditioning the surface of plastic part for subsequent electroplating can be found in U.S. Pat. No. 4,039,714, and modifications of this improved process can be found in U.S. Pat. No. 4,308,301. The inventions of these patents, however, are subjected to the previously described problem of sulfuric acid condensation and have a further disadvantage in that a prolonged conditioning time produces an unsatisfactory bond strength.

The aforementioned prior art treatments all relate to the etching step in a metal plating process. The remaining process steps include:

(a) sensitizing the etched surface of the plastic material by immersing the plastic into an acidified solution of stannous chloride, (b) activating the sentizized surface by immersing it into an ionic solution containing a noble metal catalyst to absorb metal nuclei onto the surface, and (c) electroless metal plating a desired metal onto the noble metal nuclei.

DESCRIPTION OF THE INVENTION

It is one object of the present invention to provide a simple and highly effective process for treating or preparing the surface of any kind of plastic or elastomeric material so that the treated surface is able to accept a uniform and highly adherent metal coating.

Another object of the present invention is to provide a new process for metal plating plastic or elastomeric materials which utilizes an improved surface preparation treatment.

A further objective is to provide plated plastic or elastomeric articles which are coated with a uniform metal layer of high bond strength.

Other objects of the present invention and advantageous features thereof will become apparent as the description proceeds.

Basically, the process for treating or conditioning the surface of a plastic material comprises (a) exposing the plastic material to a gas-etch atmosphere containing sulfur trioxide or a halogenated sulfonic acid in a inert gas, and (b) activating the treated surface by contact with a metal colloid catalyst to render the surface receptive to electroless metal deposits.

Step (a) is known in the art and is represented by U.S. Pat. Nos. 4,308,301 and 4,039,714, and the content of each of those patents is expressly incorporated by reference herein.

Other gases such as chlorine can at times be advantageously used in admixture with sulfur trioxide but in an amount so that the sulfur trioxide remains the primary etching gas.

Another advantage relates to the tolerance of a colloidal metal to humidity or moisture in the treating gas without affecting the uniformity of the surface conditioning. A practical advantage of this is that ambient air of high humidity can be used in the gas etch step to improve the surface etch results for subsequent activation with a metal colloid activator. The amount of water contained with the treating gas or gas carrier (air) is not critical so long as the amount is sufficient to improve the etching results. The amount of water present should not be too high so that sufficient $SO_3$ residual gas is left to properly etch the substrate. A relative humidity of between 10 to 90% has been found to be satisfactory.

Satisfactory operating temperatures for this process can range from ambient to 275° F., although it is preferably carried out at about 100°–150° F.

One of the key inventive features to the improved results of this process is the use of colloidal metals to activate the surface of the plastic or elastomeric material. The prior art processsses utilized either one or two-step ionic noble metal catalysts in the activation step. For improved results, a sensitizing treatment of immersing the material to be plated into a acidified solution of stannous chloride was performed prior to activation. In the early stages of development of these processes, however, the prior art taught that colloidal noble metals such as colloidal palladium should not be used with gaseous sulfonation if a good quality electroplated coating was to be obtained on a plastic or elastomeric substrate. Surprisingly, in the present invention, the use of colloidal metals for activating surfaces treated with gaseous sulfonation compounds or similar atmospheres achieves certain benefits over the prior art. For example, when using colloidal metals, the degree of etch on the plastic can be varied over a much wider range compared with the very narrow requirements of etching that is needed when using an ionic catalyst.

A further advantage when using colloidal catalysts also relates to the conditioning time. Whereas the prior art teaches that prolonged treatments provide poor bond strengths, the present invention finds the opposite; that the bond strength of the plated coating is improved with prolonged treatments of set conditions of gas concentration, temperature, etc. A prolonged treatment for ABS resin, for example, would be 70 seconds at 10 mole percent $SO_3$ and 140 seconds at 8.5 mole percent $SO_3$.

The etch reaction can thus be regulated or controlled to accept a uniform deposit of colloidal catalysts by regulating the $SO_3$ concentration, time of reaction, temperature, humidity conditions, and terminating the reaction in the treating chamber by treatment with ammonia, for example. Terminating the reaction in the treating chamber is particularly advantageous when using high mole percent $SO_3$ concentrations. The regulation and control of the etching step is, in essence, empirical and will vary depending on the plastic being employed. The degree of etch can be determined by routine experimentation for any plastic that will react with $SO_3$. Thus, applicants have discovered that the surface etch can be controlled to subsequently accept a colloidal metal activating agent which was previously not thought to be possible.

Regarding the types of metal colloid catalysts that are useful in the activation step of the process of the present invention, noble metals in colloid form provide the best results. This would include colloids of palladium, platinum, silver or gold, as well as other known noble metals. It has also been found, however, that the less expensive, more common, transition metal colloid catalysts also provide satisfactory results. This category would include copper, nickel, cobalt, and iron. Also, metal oxide or metal halide colloids can be used, as can combinations of any of these metal, metal oxide, or metal halide colloids. The colloidal metals, whether they be elemental, oxides, halides, or mixtures thereof should have a sufficiently low valence to cause activation of the plastic surface for subsequent electroless deposition. These colloidal metal solutions are well known in the art and have been used commercially for many years. If the metal colloidal solution is an oxide having a high valence state, reduction of the oxide colloid after deposition on the plastic surface may be necessary to achieve activation.

The metal colloids can be used in a one step or two step process and plastic parts are immersed into a solution of a metal colloid in a conventional manner. Generally, the solution is maintained at about 70° to 140° F. and preferably at about 80°-100° F., and the parts are immersed for about 0.5 to 10 and preferably 1-3 minutes.

In another aspect of this process, a one or two step conditioner treatment is used after the gas etch treatment but before the activation step to improve the degree of surface activation by the metal colloids.

The two step conditioner treatment consists of a first step where the material to be plated is immersed into a non-ionic surfactant conditioner solution following the gas etch, and a second step, whereby the conditioned plastic material is rinsed in an alkaline solution of a pH 9 or above. The use of this conditioning treatment permits a greater proportion of the metal colloid to be adsorbed onto the plastic surface than would otherwise occur. The greater the metal colloid included on the surface of the etched plastic, the easier it is to initiate metal plating.

The one step conditioner treatment consists of a solution comprising a suitable non-ionic surfactant in an alkaline cleaner described previously. In preparation, it is preferred to add the surface active agent to the alkaline or acid solution. The alkaline solution can be the same as that described below with respect to the two step conditioner treatment. In case of the one step conditioner treatment the pH can range between about 1 and 12. The preferred alkalis to be used are trisodium phosphate and sodium carbonate. Hydrochloric acid is the preferred acid.

These surfactants include any non-ionic surfactants alone or in combination in a concentration of from about 0.1 to about 1 weight percent, and preferably about 0.2 weight percent. The temperatures and immersion times would be the same as for the alkaline cleaner step. The use of the conditioners permits additional advantages such as a broader operating range of etch, a broader list of permissible plastics that can be treated with good results, better adhesion to the plastic surface, and other similar improvements.

The conditioner treatment (one or two step) promotes absorption of the catalyst by interacting in some manner with the surface of the etched plastic. The present invention utilizes non-ionic polyoxyalkylenes or alkyl phenol polyoxyalkylene adduct solutions, such as polyoxyethylenated polyoxypropylene glycols and polyoxyethylenated alkylphenol. Polyoxyethylene glycol is preferred. The non-ionic sufactants can be used alone or in combination with each other. Amphoteric surfactants can also be used in combination with the non-ionic surfactants. Aryl containing surfactants are best utilized with the one step conditioner treatment, alkyl phenol ethoxalates are preferred. A conditioner concentration of from about 0.1 to 10 weight percent in a solvent of deionized water can be used and 1 weight percent is preferred. The conditioner solution temperature can range between 70° and 160° F. and is typically about 100° to 130° F. The part to be conditioned is immersed into this bath for a period of 0.5 to 10 minutes and preferably about 1-2 minutes.

The alkaline cleaning solution used to rinse the parts after exposure to the conditioner solution has a pH of about 9 or above, preferably 11. Commercially available alkalis such as sodium or potassium hydroxide, sodium or potassium carbonate, trisodium phosphate or the like can be used. A solution temperature range of between 70° and 200° F. can be used with 125° to 145° F. being preferred. Parts are immersed between 0.5 to 10 minutes, and preferably 1 to 2 minutes.

After cleaning, with or without the use of a conditioner, a neutralizer dip is used to remove any residual alkali from the surface of the plastic parts. The neutralizers used are typically acid, such as 10 to 30% hydrochloric, and they can also include complexing or reducing agents if desired. Processing conditions can include a bath temperature of from 70° to 170° F., preferably 100°-120° F., and an immersion time of 0.5 to 5 minutes, preferably 1-2 minutes. When the one step conditioner employs acid, neutralization is not necessary. However, some acid dip is advantageous to insure removal of the excess surfactant from the surface.

The activation step of the process of the current invention utilizes the conventional and known metal colloids described above, and is a surprising improvement over the one or two step ionic catalysts of the prior art.

The accelerator step that follows activation removes any stannous chloride or stannous hydroxide from the part surface by treatment in a dilute solution of acid or acid salt as is well known in the art. Typically, a 10% by weight hydrochloric acid solution is used, but chloride or fluoride salts, and chlorinated or fluorinated compounds can be added to increase the effectiveness of the acceleration process. Usually, this solution is maintained between 70° and 165° F. and preferably at about 110°-120° F. It sometimes is agitated with air, and parts are immersed from 5.0 to 5 minutes and preferably about 1 minute.

Metal plating electrolessly occurs when the activated parts are immersed into a solution containing a metal salt, and a reducing agent. Complexing agents, stabilizers, and a buffer to control pH are also generally employed. Nickel or copper can be autocatalytically deposited onto the activated plastic or elastomeric part. The metal colloid on the surface acts as a catalyst to initiate deposition after which autocatalytic reduction of the metal occurs. A uniform metal film of about 0.25 to 0.5 $\mu$m thick is usually deposited. These electroless plating solutions are well known in the art and commercially available.

The commercially available processes for depositing nickel commonly use sodium hypophosphite as the reducing agent. These solutions are generally held at between about 70° and 160° F. and preferably at between about 90° and 100° F., at an alkaline pH, preferably between 8 and 11, and parts are immersed in the solution for 5 to 10 minutes. The deposit generally contains 2 to 6 percent phosphorus, balance nickel. There can be considerable variations in bath formulations, and such solutions can contain nickel sulfate, sodium citrate, ammonium chloride, ammonium hydroxide, or sodium hydroxide. In addition, stabilizers can be added to prevent decomposition of the solution or to control the deposition rate.

Copper deposition processes use formaldehyde as the reducing agent, while bath temperatures and exposure time are similar to those for nickel.

After the initial layer of copper or nickel is deposited, subsequent layers of metal can be plated from suitable standard metal electroplating baths such as copper, nickel, or chromium.

Finally, it should be noted that after each step of the process, a thorough water wash or rinse is desireable to obtain a successfully deposited metal coating. Also, multiple water rinses, where practical, are recommended.

Electroplating is performed in a conventional manner as is well known in the art by placing or suspending the activated plastic material or article as the cathode into an electrolyte. The metal to be deposited is used as an anode and the electrodes are connected to a current source. The cathode current density is adjusted to correspond to the optimum working conditions of the electrolyte.

For the purposes of this invention, metal plating is used to include conventional electroplating, as well as the so called "electroless" plating processes (i.e.—those processes for metal plating that do not use an applied electric current). The most common electroless process is the catalyzed chemical reduction method, and this is characterized by the selective reduction of metal ions at the surface of a catalyzed substrate which is immersed in an aqueous solution. This reduction continues to occur onto the substrate through the catalytic action of the deposit itself. The advantage of electroless plating over electrolytic electroplating is that a dense, virtually non-porous metal coating of uniform thickness is provided on all surfaces of the part regardless of its shape or geometry.

The process of the present invention is operable with any plastic or elastomeric material that will react with $SO_3$. Examples of these materials are given in U.S. Pat. No. 4,039,714 to Roubal, et al, and are expressly incorporated herein by reference.

The plastic or elastomeric substrate may contain conventional filler materials such as glass fibers, asbestos, other mineral fillers, sawdust, carbonaceous materials such as graphite, dyestuffs, pigments, etc.

The plastic carrier for the metal layer may be of different shape such as in the form of films, foils, molded articles, rods, fibers, foams, woven textile materials, or the like.

Also, the plated plastic articles of the present invention can be subsequently heat treated without adversely affecting the quality of the metal coating. In fact, heat treatments usually improve the bond strength of these coatings considerably as is well known.

Finally, the plated plastic or elastomeric articles produced by these metal plating processes are characterized by a uniform, dense metal coating that is strongly adherent.

While it is apparent that the invention herein disclosed is well calculated to fulfill the objects above stated, it will be appreciated that numerous modifications and embodiments may be devised by those skilled in the art, and it is intended that the appended claims cover all such modifications and embodiments as fall within the true spirit and scope of the present invention.

EXAMPLES

A further understanding of the present invention, and the advantages thereof, can be had by reference to the following examples.

EXAMPLE 1

This example demonstrates the beneficial effects of humidity in the processing of plastics for plating applications. Also, a colloidal palladium/tin catalyst was used in place of an ionic palladium/tin two step catalyst.

The test parts in this example were made of ABS plastic and were to be plated for decorative purposes. Two samples were etched as follows:

Sample 1:

2½ minutes, 1 mole percent sulfur trioxide under dry air conditions.

Sample 2:

2½ minutes, 1 mole percent sulfur trioxide under ambient (humid) air conditions.

Both samples were subsequently neutralized with gaseous ammonia, and then processed through the following plating cycle:

(1) Water Rinse
(2) Alkaline cleaner (sodium carbonate and trisodium phosphate pH=11) for 2½ minutes at 130° F.
(3) Water Rinse
(4) Neutralizer dip (30% hydrochloric acid)
(5) Colloidal palladium/tin catalyst for 2½ minutes at 100° F. (palladium concentration 30 ppm).
(6) Water Rinse
(7) Accelerator (10% hydrochloric acid) for 1½ minutes at 125° F.
(8) Water Rinse
(9) Electroless nickel bath for 7 minutes at 80° F.
(10) Water Rinse
(11) Copper Plate
(12) Nickel Plate
(13) Chrome Plate The results obtained are tabulated in Table 1, and show that humidity in the gas etching step results in more uniform, better adherent coatings.

TABLE 1

| Item | Sample 1 | Sample 2 |
| --- | --- | --- |
| Etch Condition | Dry Air | Humid Air |
| Coverage | 80% | 100% |
| Adhesion | Poor (blistered coating) | Good |
| Rack plating | None | None |

EXAMPLE 2

The parts of Example 1 were also processed using a different catalyst concentration (step 5) and different accelerator conditions (step 7) as follows:

(5) Colloidal palladium/tin catalyst for 2¼ minutes at 100° F. (palladium concentration=40 ppm)
(7) Accelerator (10% hydrochloric acid) for 2½ minutes at 120° F.

Upon plating those parts, the following results were obtained.

TABLE II

| Item | Sample 1 | Sample 2 |
| --- | --- | --- |
| Etch Condition | Dry Air | Humid Air |
| Coverage | 90–95% | 100% |
| Adhesion | Good | Good |
| Rack Plating | Yes | No |

Regarding Examples 1 and 2, it is not obvious that the introduction of humidity in the etching step will produce a beneficial effect in terms of selectively etching the part surface and not the rack coating when preparing of ABS for decorative and/or functional plating. Rack plating refers to plating taking place on the plastisol coatings used on plating racks as insulation, and it is very undesirable to have any plating take place here.

EXAMPLE 3

To demonstrate the improvement involved in the use of a conditioner step followed by an alkaline cleaner step, the following tests were performed.

Four samples of impact resistant polystyrene test panels (Styron 484 made by Dow Chemical Co.) were etched by exposure for 6½ minutes to 1 mole percent sulfur trioxide under dry air conditions as in Example 1. The parts were then neutralized with gaseous ammonia in the etching vessel and subsequently treated as follows:

| Step | Processing Time For Samples (Minutes) | | | |
| --- | --- | --- | --- | --- |
| | 1 | 2 | 3 | 4 |
| Conditioner (1% Polyoxyethyleneglycol), 70 F. | — | 1 | 2½ | 2½ |
| Alkaline cleaner, (sodium carbonate and trisodium phosphate, pH = 11), 130 F. | — | 1 | 1 | — |
| Neutralizer (10% hydrochloric acid), | — | dip | dip | dip |
| Colloidal palladium/tin catalyst, 80–85 F. (30 ppm Pd) | 2½ | 2½ | 2½ | 2½ |
| Accelerator (10% acid), 105–110 F. | 1½ | 1½ | 1½ | 1½ |
| Electroless nickel bath, 85 F. | 8 | 8 | 8 | 8 |

Results are tabulated below in Table III.

TABLE III

| Property | 1 | 2 | 3 | 4 |
| --- | --- | --- | --- | --- |
| Percent Coverage | 5% | 100% | 100% | 100% |
| Tape Adhesion (ASTM Test D-3359) | — | Fair | Good | Fails |

The results of Examples 3 and 4 show that the interaction of a sulfonated surface with a one or two step conditioner, will produce a completely coated, well adherent metal coating on the plastic. This process also works on other types of plastics, such as glass filled polyesters, polysulfones, polycarbonates, as well as others, whether in the foam or solid state.

EXAMPLE 4

To demonstrate the effectiveness of a one-step conditioner treatment, three samples of a modified polyphenylene oxide material (Noryl 190, manufactured by General Electric Co.) were etched in an atmospheric containing 1 mole percent $SO_3$ under dry air conditions, neutralized as in Example 3, and subsequently processed as follows.

| Step | Processing Exposure Time for Samples (minutes) | | |
| --- | --- | --- | --- |
| | 1 | 2 | 3 |
| Conditioner (1% polyoxyethylene glycol), 70 F. | 1 | — | — |
| Conditioner (0.2% polyoxyethylene glycol) in Alkaline Cleaner, 130 F. | — | — | 1 |
| Alkaline Cleaner (Sodium carbonate trisodium phosphate pH = 11) | 1 | 1 | — |
| Neutralizer (30% hydrochloric acid) | dip | dip | dip |
| Colloidal palladium/tin catalyst, 85 F. (30 ppm Pd) | 2.5 | 2.5 | 2.5 |
| Accelerator (10% hydrochloric acid), 105–110 F. | 1.5 | 1.5 | 1.5 |
| Electroless Nickel Bath, 85 F. | 10 | 10 | 10 |

Results are tabulated in Table IV.

TABLE IV

| Property | Sample 1 | Sample 2 | Sample 3 |
|---|---|---|---|
| Percent Coverage | 100 | 0 | 100 |
| Tape Adhesion (ASTM Test B-3359) | Excellent | — | Excellent |

EXAMPLE 5

To demonstrate that exposure of plastics to high sulfur trioxide concentrations does not adversely effect the adhesion of the applied metallic layer to the plastic substrate, the following test was conducted.

Five ABS substrates were etched with varying sulfur trioxide concentrations as follows:

| Sample | sulfur trioxide concentration (mole %) | exposure time (seconds) |
|---|---|---|
| 1 | 3.3 | 140 |
| 2 | 5 | 140 |
| 3 | 8.5 | 140 |
| 4 | 8.5 | 70 |
| 5 | 10 | 70 |

The samples were further processed as follows:

| Step | 1 | 2 | 3 | 4 | 5 | |
|---|---|---|---|---|---|---|
| Colloidal palladium/tin catalyst | 2 | 3 | 3 | 6 | 5 | |
| Accelerator (10% hydrochloric acid) | 1 | 1 | 3 | 1 | 10 | (seconds) |
| Electroless nickel bath | 6 | 6 | 6 | 6 | 6 | |

After processing, the sample was electroplated with copper and the adhesion of the coating was measured. Results are below in Table IV.

TABLE V

| | Sample 1 | Sample 2 | Sample 3 | Sample 4 | Sample 5 |
|---|---|---|---|---|---|
| Adhesion (lbs/in) | 4 | 4 | 8 | 4 | 8 |

EXAMPLE 6

In contrast to the above, ionic palladium used in solutions as a two step catalyzation process produces a result which varies in adhesion in a more dramatic way compared with the colloidal palladium/tin catalyzation procedure on sulfonated surfaces of ABS. For example, five ABS samples were sulfonated by exposure to sulfur trioxide gas and one half of each sample was analyzed to determine the surface concentration of sulfur resulting from the reaction of the polymer and sulfur trioxide gas. The remaining half of the panel was exposed to a two step ionic tin, ionic palladium catalyzation process followed by electroless nickel and a 25 micron copper electrodeposit. The pull adhesion as measured according to ASTM-B-533 was correlated to the degree of sulfonation, and the results are listed in Table VI.

TABLE VI

| Sample | Peel Strength Pounds/in. | Sulfur Conc. mg/cm$^2$ |
|---|---|---|
| Unetched | 0 | 2 |
| 1 | 2 | 7 |
| 2 | 7.0 | 12 |
| 3 | 7.5 | 14 |
| 4 | 7.3 | 16 |
| 5 | 2 | 39 |

Sample 5 in Table IV corresponds to Sample 5 in Table V. It is apparent that the adhesion values fall more rapidly in the case of processing with ionic solution two stage catalyst compared to the colloidal catalyst.

EXAMPLE 7

A non-precious metal colloid activating solution can be employed to catalyze and promote adhesion of metal to plastic on sulfonated surfaces. Accordingly, ABS panels (EP 3510 Cycolac) were treated with sulfur trioxide gas at 1 mole percent concentration for 2.5 minutes and subsequently exposed to an activating copper colloid. Following this exposure, the panel was immersed in an electroless copper solution followed by copper electrodeposition. Adhesion tests according to ASTM B533 produced 4.5 to 5.5 lbs/inch width adhesion for the plate.

EXAMPLE 8

To demonstrate the importance of the conditioner, glass filled polyester samples were etched for 2½ minutes in a 2 mole percent dry sulfur trioxide and neutralized with gaseous ammonia in the reaction vessel. The four samples were then removed, rinsed in water, and processed.

The processing time for each sample is given below:

| Step | 1 | 2 | 3 | 4 |
|---|---|---|---|---|
| Alkaline Cleaner (sodium cargonate and trisodium phosphate pH = 11) 130 F. | 1 | 1 | 1 | 1 |
| Neutralizer (30% hydrochloric acid) 70 F. | ½ | ½ | ½ | ½ |
| Colloidal palladium/tin catalyst (palladium concentration = 40 ppm) 100 F. | 3 | 10 | 15 | 3 |
| Accelerator (10% hydrochloric acid) 110 F. | 1 | 1 | 1 | 1 |
| Electroless nickel bath 90 F. pH 8.6 | 30 | 30 | 30 | 30 |

Sample 4 was also exposed to a conditioner for 2 minutes at 70° F. before being processed according to the steps in the table.

The results for all samples are given in Table VII.

TABLE VII

| SAMPLE | 1 | 2 | 3 | 4 |
|---|---|---|---|---|
| Coverage | skips | 100% | 100% | 100% |
| Tape Adhesion (ASTM test B-3359) | Fails | Fails | Good | Good |

It can be seen that, whereas without the conditioner the sample would have to stay in the catalyst for 15 minutes in order to obtain acceptable results in terms of adhesion and coverage, when the conditioning step is included the catalyst residence time can be reduced considerably with similar results.

EXAMPLE 9

Glass filled polyester samples were etched for 5 minutes in 2 mole percent sulfur trioxide gas under humid air conditions, neutralized as in Example 7, and subsequently processed as follows:

Samples 1 and 2 were exposed to a catalyst having a palladium concentration of 60 ppm, Sample 3 100 ppm and Sample 4 40 ppm. The processing time for each sample is given below.

| Step | Processing Exposure Time for Samples (minutes) | | | |
|---|---|---|---|---|
| | 1 | 2 | 3 | 4 |
| Alkaline Cleaner (sodium carbonate and trisodium phosphate, pH = 11) (130 F.) | 1 | 1 | 1 | 1 |
| Neutralizer (10% hydrochloric acid) (70 F.) | ½ | ½ | ½ | ½ |
| Colloidal palladium/tin catalyst (100 F.) | 3 | 5 | 10 | 3 |
| Accelerator (10% hydrochloric acid) (110 F.) | 1 | 1 | 1 | 1 |
| Electroless nickel bath pH = 8.6 (90 F.) | 30 | 30 | 30 | 30 |

Sample 4 was also exposed to the conditioner for 1½ minutes before being processed according to the steps in the table.

The results for all samples are given in TABLE VIII:

TABLE VIII

| SAMPLE | 1 | 2 | 3 | 4 |
|---|---|---|---|---|
| Coverage | 25% | 70% | 100% | 100% |
| Adhesion | Fails | Fails | Fails | Good |

These samples show that the use of the conditioner enables the use of low catalyst concentrations and short processing times while still obtaining acceptable results (i.e., 100% coverage and good adhesion using the ASTM D-3359 tape test.)

The electroless nickel bath used in the above Examples contained 6 g/l of nickel as $NiCl_2 \times 6H_2O$, ammonium chloride 30 g/l, ammonium citrate 15 g/l, sodium hypophosphate 30 g/l and water.

Having thus described our invention, what we claim as new and desire to secure by Letters Patent are:

1. A process for metal plating the surface of a plastic or elastomeric material comprising the steps of
   (a) gas-etching the surface of said material with sulfur trioxide,
   (b) treating the etched surface with a conditioning agent comprising a non-ionic surfactant to render the surface acceptable for activation with a catalytic metal colloid,
   (c) depositing said activating colloid from a colloidal metal solution, and
   (d) plating a metal coating upon the activated surface from an electroless metal bath.

2. The process according to claim 1 wherein said atmosphere contains a sufficient amount of water vapor to improve the degree of etch.

3. The process according to claim 1 wherein said metal colloid is a noble metal colloid or a transition metal colloid.

4. The process according to claim 3 wherein said noble metal colloid is a colloid of palladium, platinum, silver, or gold.

5. The process according to claim 3 wherein said transition metal colloid is a colloid of copper, nickel, cobalt, or iron.

6. The process according to claim 1 in which the surface is cleaned with an alkaline solution after conditioning.

7. The process according to claim 1 in which the conditioning agent contains the alkaline cleaner.

8. The process according to claim 6 in which the surface is subsequently neutralized.

9. The process according to claim 7 in which the surface is subsequently neutralized.

10. A process for metal plating the surface of a plastic or elastomeric material comprising the steps of
    (a) subjecting the surface of said material to the gas-etching atmosphere of sulfur trioxide,
    (b) controlling the gas-etching reaction to a point wherein the surface will accept a uniform deposit of an activating colloid,
    (c) depositing said activating colloid from a colloidal activating metal solution, and
    (d) plating a metal coating upon the activated surface from an electroless metal bath.

11. The process according to claim 10 wherein said atmosphere contains a sufficient amount of water vapor to improve the degree of etch.

12. The process according to claim 10 wherein said metal colloid is a colloid is a noble metal colloid or a transition metal colloid.

13. The process according to claim 11 wherein said noble metal colloid is a colloid of palladium, platinum, silver, or gold.

14. The process according to claim 10 wherein said transition metal colloid is a colloid of copper, nickel, cobalt, or iron.

15. The process according to claim 1 which further comprises the step of reinforcing the metal layer deposited from said electroless plating bath by depositing additional metal plating on said material electrolytically.

16. The process according to claim 10 which further comprises the step of reinforcing the metal layer deposited from said electroless plating bath by depositing additional metal plating on said material electrolytically.

* * * * *

UNITED STATES PATENT AND TRADEMARK OFFICE
CERTIFICATE OF CORRECTION

PATENT NO. : 4,520,046

DATED : May 28, 1985

INVENTOR(S) : John E. McCaskie and Chris Tsiamis

It is certified that error appears in the above-identified patent and that said Letters Patent is hereby corrected as shown below:

Column 5, line 27: change "5.0 to 5" to --0.5 to 5--.

Column 8, line 44: change "atmospheric" to --atmosphere--.

Column 9, line 39: change "Table IV" to --Table V--.

Column 10, line 10: change "Table IV" to --Table VI--.

Signed and Sealed this

Fifteenth Day of October 1985

[SEAL]

Attest:

Attesting Officer

DONALD J. QUIGG

Commissioner of Patents and
Trademarks—Designate